United States Patent [19]

Asano et al.

[11] Patent Number: 4,810,048
[45] Date of Patent: Mar. 7, 1989

[54] MECHANICAL PART MOUNTING CHASSIS WITH INTEGRATED CIRCUIT

[75] Inventors: Hideki Asano, Mito; Shuji Eguchi, Hitachi; Seikichi Tanno, Hitachi; Yoshiaki Okabe, Hitachi; Noriaki Taketani, Hitachi; Masanori Nemoto, Taga; Tuneo Narusawa, Hitachi; Yoshimitsu Mihara, Hitachi; Yukihiko Takada, Katsuta, all of Japan

[73] Assignee: Hitachi, Ltd., Tokyo, Japan

[21] Appl. No.: 788,258

[22] Filed: Oct. 17, 1985

[30] Foreign Application Priority Data

Oct. 19, 1984 [JP] Japan .................. 59-218406

[51] Int. Cl.[4] .............................................. G02B 6/12
[52] U.S. Cl. .................... 350/96.11; 174/68.5; 357/40; 360/137; 361/399
[58] Field of Search ............... 174/68.5; 360/137; 350/96.14, 96.11; 250/227; 357/40; 361/399

[56] References Cited

U.S. PATENT DOCUMENTS

| 3,663,194 | 5/1972 | Greenstein et al. | 350/96.11 X |
|---|---|---|---|
| 4,180,608 | 12/1979 | Del | 174/68.5 X |
| 4,217,624 | 8/1980 | Tuck | 361/399 X |
| 4,249,229 | 2/1981 | Hester | 361/399 |
| 4,268,113 | 5/1981 | Noel Jr. | 350/96.20 |
| 4,378,917 | 4/1983 | Negishi et al. | 361/399 X |
| 4,445,159 | 4/1984 | Nemoto et al. | 360/137 |
| 4,452,847 | 6/1984 | Siemon | 174/68.5 X |
| 4,471,898 | 9/1984 | Parker | 361/399 X |
| 4,584,767 | 4/1986 | Gregory | 174/68.5 X |
| 4,616,413 | 10/1986 | Iliou et al. | 174/68.5 X |
| 4,647,148 | 3/1987 | Katagiri | 250/227 X |
| 4,711,992 | 12/1987 | Sekine | 361/399 X |

Primary Examiner—John D. Lee
Attorney, Agent, or Firm—Antonelli, Terry & Wands

[57] ABSTRACT

This invention comprises unifying circuits with a base on which mechanical parts are mounted and relates to a mechanical part mounting chassis provided with a substrate and a circuit buried in the substrate and/or spread out on the substrate surface.

12 Claims, 7 Drawing Sheets

MECHANICAL PART MOUNTING CHASSIS WITH INTEGRATED CIRCUIT

BACKGROUND OF THE INVENTION

1. Field of the Invention

This invention relates to a mechanical part mounting chassis, and is particularly concerned with a mechanical part mounting chassis preferable for mounting mechanical parts in electric products such as household electric appliances, OA equipment and the like which are intended for public welfare.

2. Description of the Prior Art

As disclosed in U.S. Pat. No. 4,445,159 and Japanese Patent Publication No. 9934/1982, a conventional mechanical part mounting chassis is functional as a base board for mounting mechanical parts thereon; however, the situation is such that electric wiring and lighting means are disposed in the product independently of each other, i.e., each occupies its own space. Moreover, a portion using optical signals such as light emitting element, flashlight lamp and the like as the lighting means involves electric circuit, wire and other components which are incidental thereto, which greatly hinders miniaturization and weight reduction.

SUMMARY OF THE INVENTION

An object of the invention is to provide a mechanical part mounting chassis which is suitable for miniaturization and for lightweight construction by decreasing the number of discrete parts in the finished product.

A mechanical part mounting chassis relating to a first invention comprises a substrate and a circuit embedded in the substrate and/or provided to be spread out on the substrate surface. The circuit comprises individual or combined electric circuits and optical circuits in the invention.

A mechanical part mounting chassis relating to a second invention comprises a printed circuit board having an electric circuit arranged thereon and a continuity through perforated and a part fixing hole therein, and a resin structural part formed on both sides of the printed circuit board through the part fixing hole, the resin structural part including portions for mechanical parts and a mechanical part mounting part.

A mechanical parts mounting chassis relating to a third invention comprises a printed circuit board having an electric circuit and an optical circuit arranged thereon and a continuity through hole and a part fixing hole perforated therein, and a resin structural part formed on both sides of the printed circuit board through the part fixing hole, the resin structural part including portions for the mechanical parts and the mechanical parts mounting part.

A mechanical part mounting chassis relating to a fourth invention is a chassis for a magnetic recording apparatus. That is, in a magnetic recording apparatus wherein an electric circuit for driving or controlling each mechanism or the circuit and an optical circuit, and further a control panel, a display panel or a lighting means to each mechanical part are provided directly or indirectly in addition on a substrate mounted with a magnetic recording medium, a mechanical part for driving the medium, and a magnetic head scanning mechanical part for recording a signal in the medium and reading the recorded signal, the improvement characterized in that at least a part of the circuit group comprising the electric circuit and/or the optical circuit, and an optical circuit constituting a part of the lighting means is buried in the substrate and/or kept creeping on the substrate surface.

Each of the above-mentioned inventions comprises, in short, integrated circuits with a base on which mechanical parts are mounted; however, the circuits in the product need not all be integrated, i.e., a configuration in which only some of the circuits; are integrated may also be constructed, or the chassis itself can be divided, or a plurality of chassis can be combined. (Substrate)

Since the structure is rigid, it is desirable that a metallic plate, a compound molding, i.e. outsert molding, of metallic plate and resin, a resin board, that for which a metal piece is buried in the resin board, i.e. insert molding, a ceramic plate and the like be used for the substrate. In particular, the outsert molding, resin board and insert molding are practical. Further, it is desirable that a printed circuit board or a photowave guide itself be applied to the substrate. In this case, a material and a shape, chiefly thickness, will be selected preferably for the substrate in consideration of rigidity. Further, reinforcement of these circuit boards with another substrate (through buildup or insertion) is within the scope of this invention.

The conception of the chassis in the invention also implies a casing (provided with a chassis function inside) for the product itself. (Circuit)

The circuit implies at least either an electric circuit or optical circuit. A means for providing the circuit additionally on the substrate comprises burying, for example, all or a part of electric wire and an optical fiber in a resinous substrate. If the circuit is a printed circuit or a photowave guide type, then the substrate itself can be applied to these circuit boards as described above, or the circuit boards can be built upon the substrate surface (that is, the substrate working as a circuit at the same time can be reinforced by building up another plate-like member thereon).

For a printed circuit board, the circuit portion consists of a continuity through hole and a printed circuit. The circuit is formed through a normal process such as, for example, pattern chemical plating, full-additive process, panel chemical plating, electroplating, chemical/electric plating. Selection of a material with clear optical path for the photowave guide and the optical fiber, and particularly that of resin is preferable for molding and strength. Further, the electric and optical circuit can be formed on the same plane or stacked one upon the other. In the latter case, it is particularly convenient when a film optical circuit is built upon the electric circuit. Further, the invention can be embodied by designing the electric circuit to work partly as an optical circuit. Then, the optical fiber is capable of using that of glass, quartz or resin. (Resin Component)

Particularly in the second and third inventions, it is desirable that the resin component include a clear portion to allow the light to pass. In this case, it is also desirable that the optical path portion and portions for the mechanical part and the mechanical part mounting part be formed solidly of a clear resin or that the optical path portion and those for the mechanical part and the mechanical part mounting part be formed of a different resin each. Further, it is convenient that each part be fixed through a part mounting (fixing) hole within the substrate plane by means of a collar larger than a diameter of the hole in size. (Resin)

If the substrate is made of resin, then the resin will be selected preferably from among those in which a macromolecule having a glass transition temperature of 80° C. or higher is a principal component, or at least one kind of macromolecular material selected particularly from a group comprising polycarbonate, polysulfone and polyacrylate or a compound material for which an inorganic matter is compounded thereto.

A resin in which a macromolecule having a glass transition temperature of 80° C. or higher will be preferable for the resin component where a printed circuit board is utilized for the substrate or outsert molding is employed, and particularly polycarbonate, acrylonitrile-styrene copolymer, polysulfone, polyacrylate will be utilized preferably.

DETAILED DESCRIPTION OF THE PREFERRED EMBODIMENTS

Figure 1:
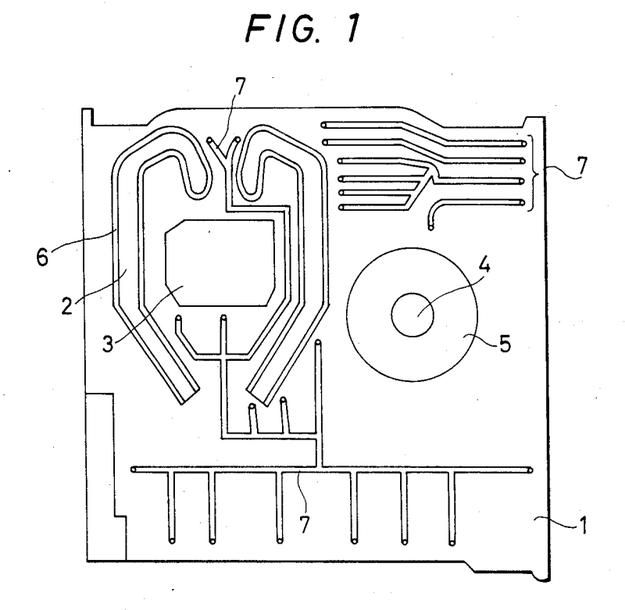
FIG. 1, FIG. 6, FIG. 7 and FIG. 16 are schematic plan views of a mechanical parts mounting chassis embodying the invention.

FIG. 1 is a schematic plan view of a chassis for a video tape recorder which is given in one embodiment of this invention. A chassis 1 is made of resin. Two tape guide holes 2, a video head installing hole 3 and a driving capstan motor mounting hole 4 are perforated in the chassis 1. A reference numeral 5 denotes a position for mounting a driving capstan motor, and this portion protrudes from a surface of the chassis 1. A circumference 6 of the guide hole 2 also protrudes likewise from the surface of the chassis 1. Electric wiring 7 is arranged on the surface of the chassis 1. Where the electric wiring 7 is exposed on the chassis surface as illustrated, it is desirable that the circuit be covered with an insulating layer 8 as shown in FIG. 2.

Figure 2:
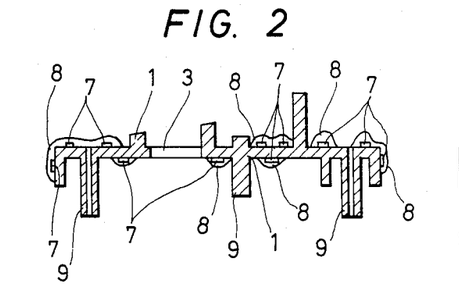
FIG. 2, FIG. 3, FIG. 8, FIG. 12, FIG. 13, FIG. 14, FIG. 15 and FIG. 17 are schematic sectional views of a mechanical parts mounting chassis embodying the invention.

FIG. 2 is a schematic sectional view of a chassis for a video tape recorder. In the example, each electric wiring line 7 is covered with the insulating layer 8. A reference numeral 9 denotes a resin structural part given in one example.

Figure 3:
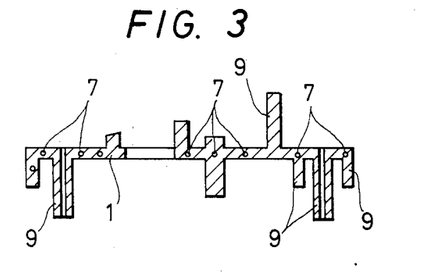

FIG. 3 represents another embodiment of the chassis for video tape recorder. In the example, each electric wiring line 7 is buried in the chassis 1 of resinous material.

Figure 4:
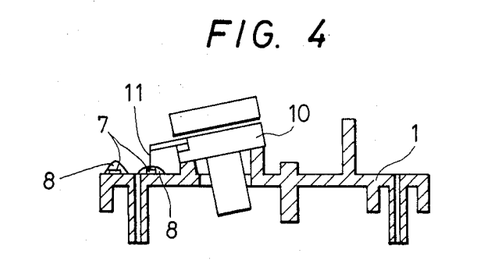
FIG. 4 is a schematic sectional view representing a state wherein an electric part is combined with the chassis shown in FIG. 3.

In the three examples given as above, a short wire 11 is sufficient enough to connect an electric part (video head 10 in FIG. 4) mounted on the chassis 1, thereby satisfying lightweight and miniaturization requirements. Further, since the wire 11 can be minimized in length, the wire can be kept from hindering an operation of each mechanical part. Then, the wire 11 is bundled to fixation, so that a space for lead-in to the electric circuit board can be saved.

Figure 5:
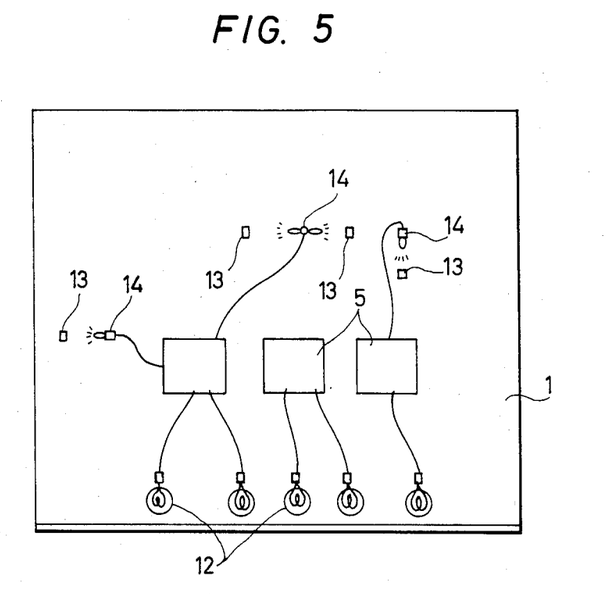
FIG. 5 is a schematic plan view of a conventional mechanical parts mounting chassis.

FIG. 5 is a schematic plan view of the inside of a display panel for indicating an operating state in a conventional magnetic recording apparatus. As will be apparent from the figure, a lighting mechanism including a plurality of flashlight lamps 12 is provided hitherto. Reference numerals 13 and 14 denote a light receiving element and a light emitting element, respectively, both of which are signal generating means for checking the running state of a magnetic recording medium. Then, the flashlight lamp 12, light receiving element 13 and light emitting element 14 are employed as separate components in one product, so that an electric circuit 15 is formed also in a plural set accordingly. Consequently, such conventional construction inevitably allows a portion for lighting concern to occupy fairly a lot of space.

Figure 6:
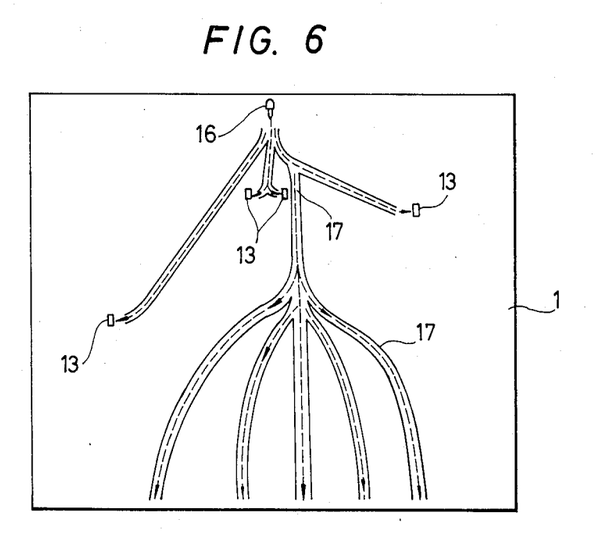

FIG. 6 represents one example of a chassis (display panel for indicating an operating state in the magnetic recording apparatus) relating to a mode of operation of the invention for removing the above-mentioned defect. As illustrated, an optical circuit 17 is disposed on the surface of the chassis 1. A reference numeral 16 denotes a light source, and the said light source can be limited to a single component according to the embodiment, thereby eliminating the need for multiple components of electric circuits and flashlight lamps. The example is an effective subsidiarily in decreasing a working power from retrenching the light source and others.

Figure 7:
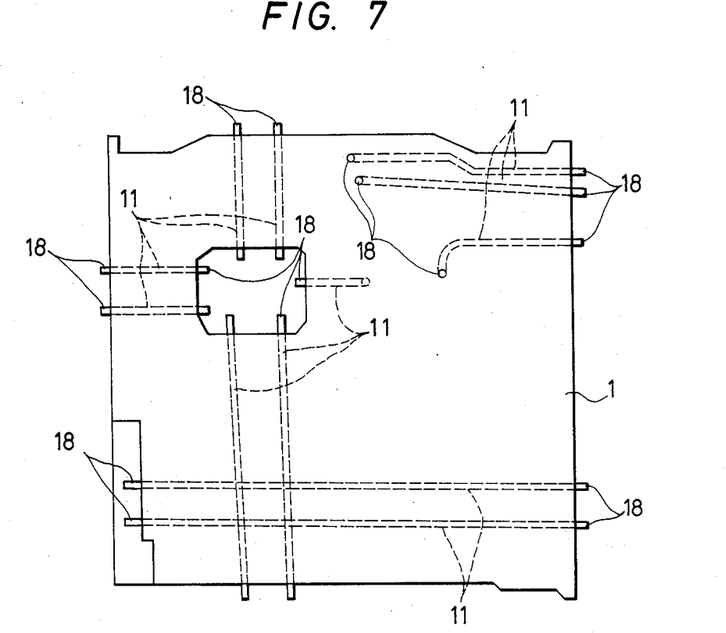
Figure 8:
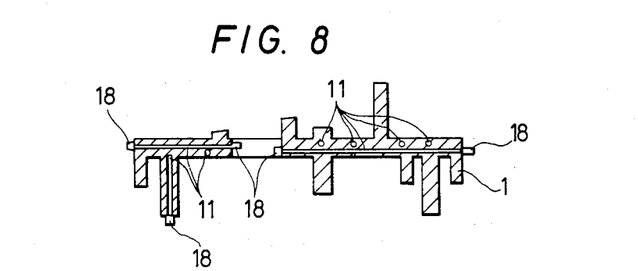
Figure 9:
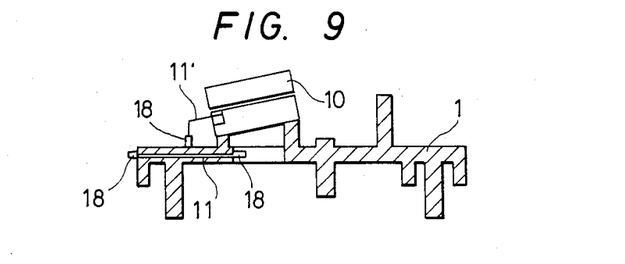
FIG. 9 is a schematic sectional view representing a state wherein an electric part is combined with the chassis shown in FIG. 8.

FIG. 7 is a plan view of a mode of operation wherein the electric circuit formed of the wire 11 is formed integrally with resin so as to be buried internally with only a connection terminal 18 exposed, and FIG. 8 is a sectional view thereof. This can be so formed by pouring a fused resin in a mold with the wire 11 fixed therein. In this case, the electric circuit is not only formed concurrently but also strengthened by the wire 11, therefore strength and rigidity of the base will be enhanced. Further, since the wire has a lower coefficient of thermal expansion than resin, dimensional variation due to temperature can be reduced. In this case, as shown in FIG. 9, a part of the wire is exposed near the electric part (video head), which can be connected otherwise through the short wire 11.

If an optical fiber is buried instead of all or a part of the wire 11 in each example described above, an optical signal or both electrical and optical signals can be transmitted. The use of glass and quartz for the optical fiber may ensure a similar strengthening effect as in the case of the above-mentioned wire.

For a magnetic recording apparatus, the internal temperature during most operation may rise as high as 60° C., or up to 70° C. during recording and tracking; therefore, if the glass transition temperature of the macromolecule which is a principal component of resin is lower than that, then it becomes rubbery, so that dimensional accuracy of the base deteriorates. Now, if maximum temperature rise is taken into consideration, a tolerance of about 10° C. will be necessary. That is, it is desirable that a resin has a macromolecule with a glass transition temperature of 80° C. or higher as a principal component. The higher the glass transition temperature, the better the dimensional stability results.

Figure 10:
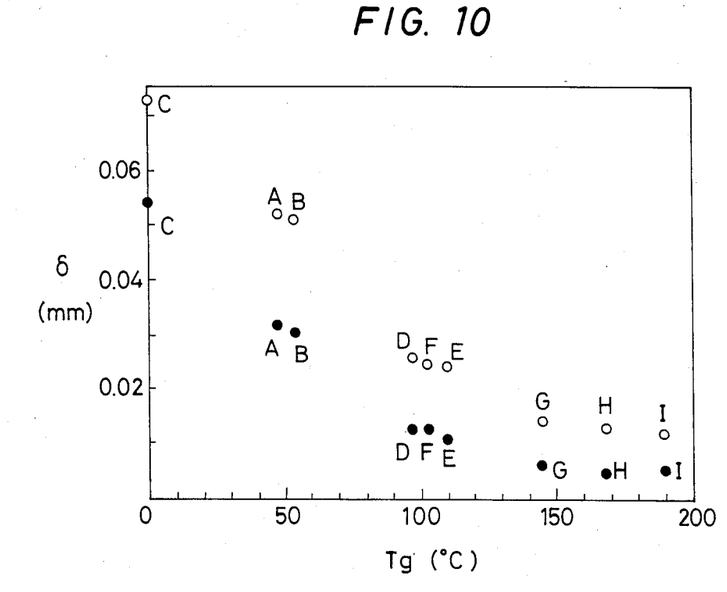
FIG. 10 is a characteristic drawing showing the relation between glass transition temperature and secular change of a resin component.

FIG. 10 shows the relation between glass transition temperature Tg and secular change δ of the macromolecule working as a principal component of the resin. Here, the secular change is indicated by the difference between the flatness of a plate 100 mm long, 50 mm wide and 3 mm thick extruded and then heated at 70° C. for 960 hours continuously and the flatness of that plate before heating. As will be apparent from the figure, that of glass transition temperature Tg 70° C. or below results in a large physical change; therefore, Tg exceeding 70° C. will be preferable. An alphabetical symbol given to each point in the figure denotes the kind of material. That is, A represents nylon 6, B represents polyacetal, C represents polypropylene, D represents polymethyl methacrylate, E represents acrylonitrile-styrene copolymer, F represents polystyrene, G represents polycarbonate, H represents polysulfone, and I represents polyallylate. Then, the drawing shows that for which glass fiber is not blended and that for which glass fiber is blended at 30% by weight. From the figure, it is understood that a small physical change ensues particularly from polycarbonate, polysulfone and polyallylate, and the small physical change may further be secured from blending glass fiber therewith. The symbol indicates that for which glass fiber is not blended, and another symbol indicates that for which glass fiber is blended.

Figure 11:
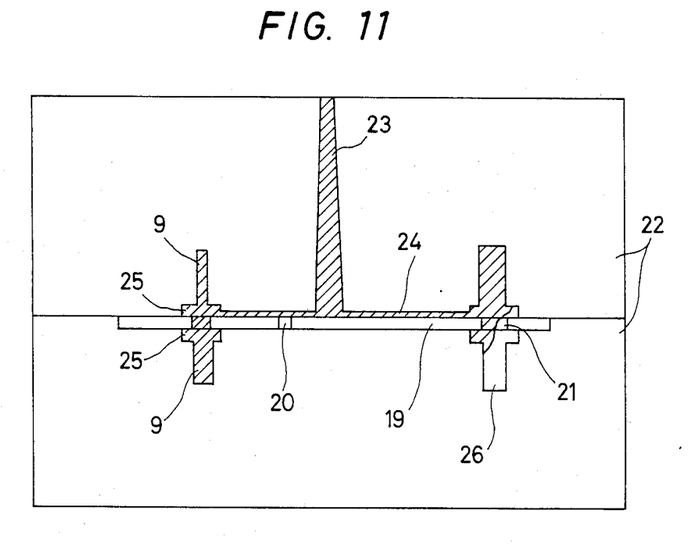
FIG. 11 and FIG. 18 are each mold sectional views representing a process for molding a mechanical part mounting chassis embodying the invention.

FIG. 11 is a mold sectional view indicating a process for unifying a circuit with the chassis.

For forming the electric circuit and the chassis integrally, a through hole 21 other than a hole 20 is provided on a printed circuit board 19 with the electric circuit formed thereon in such manner as will not cut the electric circuit. First, the printed circuit board 19 is fixed in a metal mold 22, a resin is poured therein from a gate 23 through a runner 24, and the resin structural part 9 is formed on both sides of the printed circuit board 19 through the hole 21. The resin structural part 9 has a collar 25, and the collar is larger than a diameter of the through hole 21. Each resin structural part 9 is fixed on the printed circuit board 19 through the collar 25. Then, FIG. 11 shows the state wherein the resin is on the way to flowing into the metal mold, and thus the resin has not yet flowed perfectly in a cavity 26. In the example, if the electric circuit is exposed on the chassis surface, then it will preferably be covered with an insulating layer as described hereinbefore, however, it is also useful to have the runner 24 spread along the circuit.

According to the method, the connecting wire 11 coming out of the electric part can be soldered to the through hole 20 plated with a metal therein for conductivity and thus be connected to the printed circuit board 19 through a conductive paste or other means. Here, a multi-layer printed circuit board can also be used as the printed circuit board 19.

In each example described as above, since the electric part (motor, solenoid or the like) on the chassis and the electric circuit are kept close to each other, the wiring can be held to a minimum. Accordingly, the size and weight of the finished product are reduced, thereby satisfying miniaturization and lightweight requirements.

Figure 12:
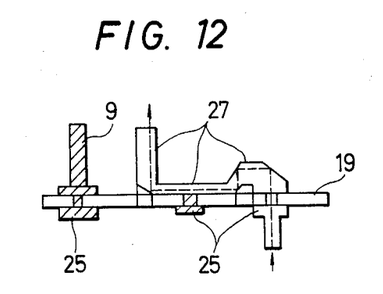
Figure 13:
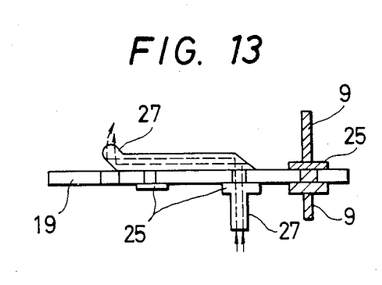
Figure 14:
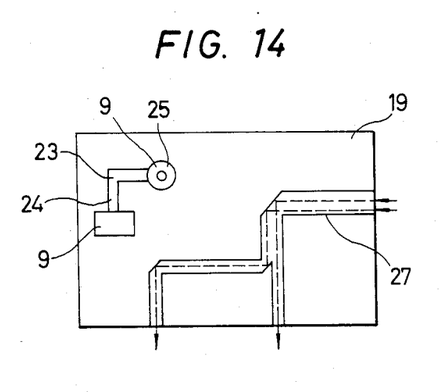

Further, as shown in FIG. 12 to FIG. 14, when a clear resin is used, it works not only as a mere resin structural part but also as a prism, lens and the like at the same time. That is, a reference numeral 27 denotes an optical circuit provided with a prism and lens in each figure.

According to the example shown in each figure, the electric circuit and the optical circuit can be formed integrally. Then, a broken line and an arrow in the figures indicate the direction in which the light is transmitted. Further, after forming the resin structural part with an opaque resin, the optical circuit part can be formed with a clear resin and vice versa. Strength and rigidity are required for the resin structural part 9, and transmissivity is required for the optical circuit 27, therefore there may be a case where the resin must be selected so as to meet that purpose. In this case, it is desirable that a resin with a macromolecular glass transition temperature of 80° C. or higher is a principal component as described hereinbefore. Further, a clear resin with a glass transition temperature of 80° C. or higher includes, as shown in FIG. 10, polycarbonate, acrylonitrile-styrene copolymer, polystyrene, polymethyl methacrylate, however, it is desirable that polycarbonate, acrylonitrile-styrene copolymer be used particularly for physical change.

Figure 15:
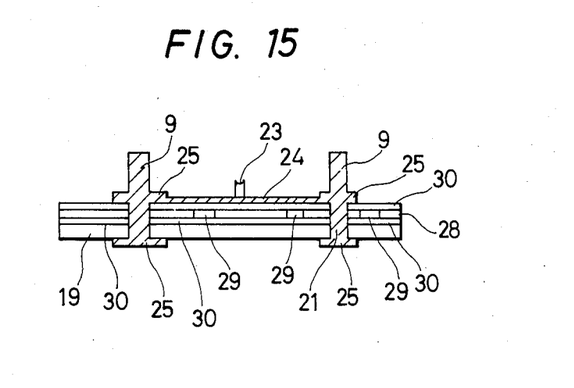
Figure 16:
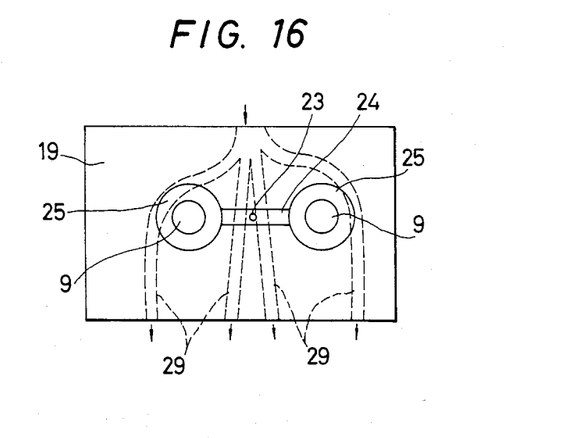

As another embodiment of this invention, there is a mode wherein a film 28 forming an optical circuit thereon is built on the printed circuit board 19 shown in FIG. 15 and FIG. 16, and the through hole 21 perforated so as not to cut the electric circuit and the optical circuit. As in the case of FIG. 11, the resin structural part 9 and the collar 25 are formed in this case. The film 28 comprises a core 29 through which the light is transmitted and a clad 30 other than that.

In each example given as above, a chassis that is superior in both strength and rigidity to that of only paper phenol and glass-epoxy substrates will be obtainable from using the printed circuit board in which an iron core is incorporated.

Then, in the example of FIG. 15 and FIG. 16, in which a macromolecule having a glass transition temperature of 80° C. or higher is a principal component is preferable as a plastic for forming the resin structural part 9, and particularly polycarbonate, polysulfone and polyacrylate will serve well as described hereinbefore.

Figure 17:
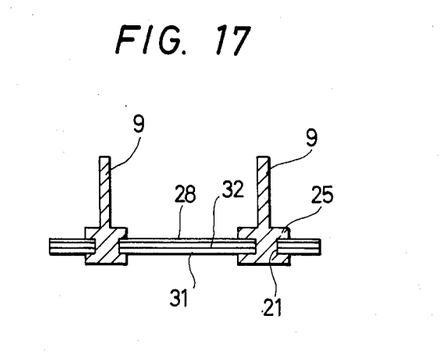
Figure 18:
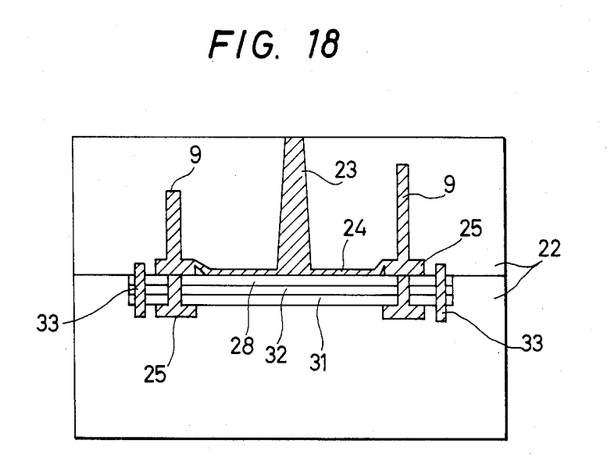

Further, FIG. 17 represents another embodiment, wherein a flexible printed board 32 and the optical circuit film 28 are built up sequentially on a metallic substrate 31, and the resin structural part is fixed by the through hole 21 and the collar 25. In the example, the runner 24 is removed, and each resin structural part 9 is almost symmetrical on a central axis of the through hole 21. Since the runner 24 is removed, deformation of the substrate due to residual thermal stress of the resin molding is minimized, so that the chassis can be made slimmer. The manufacturing process then comprises, as shown in FIG. 18 for example, building up the flexible printed board 32 and the optical circuit film 28 sequentially on the metallic substrate 31, fixing them with a guide pin 33, and pouring a resin in the mold.

It is difficult, due to space limitations, to install an electrical sensor for ensuring and controlling the position of a magnetic recording medium; however, an optical circuit will make it possible to ensure and control reasonably simply by providing a light receiving element. Accordingly, the recording precision of the apparatus can be enhanced, and recording density can also be improved.

What is claimed is:

1. A mechanical part mounting chassis comprising a substrate; driving means for driving a recording medium; means for reading a signal recorded in said recording medium; and a circuit integral with said substrate; said driving means and said means for reading a signal being mounted on said substrate.

2. A mechanical part mounting chassis according to claim 1, wherein said circuit is buried in said substrate and/or spread out on a surface of said substrate.

3. A mechanical part mounting chassis comprising a substrate;
driving means for driving a recording medium; means for reading a signal recorded in said recording medium; and a circuit integral with said substrate; said driving means and said means for reading a signal being mounted on said substrate, and said circuit being an electric circuit.

4. A mechanical part mounting chassis according to claim 3, wherein said circuit is buried in said substrate and/or spread out on a surface of said substrate.

5. A mechanical part mounting chassis comprising a substrate; driving means for driving a recording medium; means for reading a signal recorded in said recording medium; and a circuit integral with said substrate; said driving means and said means for reading a signal being mounted on said substrate, and said circuit being an optical circuit.

6. A mechanical part mounting chassis according to claim 5, wherein said circuit is buried in said substrate and/or spread out on a surface of said substrate.

7. A mechanical part mounting chassis comprising a substrate; driving means for driving a recording medium; means for reading a signal recorded in said recording medium; and a circuit integral with said substrate; said driving means and said means for reading a signal being mounted on said substrate, and said circuit comprising an optical circuit and an electric circuit.

8. The mechanical part mounting chassis as defined in claim 3 or claim 7, said electric circuit being a printed circuit.

9. A mechanical part mounting chassis as defined in claim 8, wherein said substrate is a circuit board of said printed circuit and is reinforced by another plate-like member.

10. A mechanical part mounting chassis according to claim 7, wherein said circuit is buried in said substrate and/or spread out on a surface of said substrate.

11. A mechanical part mounting chassis comprising a substrate;
driving means for driving a recording medium; means for reading a signal recorded in said recording medium; and a circuit integral with said substrate; said driving means and said means for reading a signal being mounted on said substrate, and said substrate being a compound molding of a metallic plate and a resin.

12. A mechanical part mounting chassis comprising a substrate;
driving means for driving a recording medium; means for reading a signal recorded in said recording medium; and a circuit integral with said substrate; said driving means and said means for reading a signal being mounted on said substrate, and said substrate being of a resin make.

* * * * *